United States Patent
Inspektor

Patent Number: 6,054,185
Date of Patent: *Apr. 25, 2000

[54] SUBSTRATE WITH SUPERHARD COATING CONTAINING BORON AND NITROGEN AND METHOD OF MAKING THE SAME

[75] Inventor: Aharon Inspektor, Pittsburgh, Pa.

[73] Assignee: Kennametal Inc., Latrobe, Pa.

[*] Notice: This patent is subject to a terminal disclaimer.

[21] Appl. No.: 09/208,567

[22] Filed: Dec. 9, 1998

Related U.S. Application Data

[62] Division of application No. 08/627,464, Apr. 4, 1996, Pat. No. 5,976,716.

[51] Int. Cl.⁷ .................................................. C23C 14/00
[52] U.S. Cl. ........................ 427/419.7; 204/192.1; 204/192.11; 204/298.01; 204/298.02; 204/298.05; 427/255.1; 427/255.2; 427/255.7; 427/457; 427/470; 427/530
[58] Field of Search ................................ 427/402, 419.1, 427/419.7, 427, 255.1, 255.2, 255.7, 457, 470, 530; 204/192.1, 192.11, 298.01, 298.05, 298.02

[56] References Cited

U.S. PATENT DOCUMENTS

| | | |
|---|---|---|
| 3,767,371 | 10/1973 | Wentorf et al. |
| 4,035,541 | 7/1977 | Smith et al. |
| 4,237,184 | 12/1980 | Gonseth et al. |
| 4,282,289 | 8/1981 | Kullander et al. |
| 4,399,168 | 8/1983 | Kullander et al. |
| 4,619,865 | 10/1986 | Keem et al. |
| 4,643,951 | 2/1987 | Keem et al. |
| 4,717,632 | 1/1988 | Keem et al. ...................... 428/698 |
| 4,724,169 | 2/1988 | Keem et al. |
| 4,731,303 | 3/1988 | Hirano et al. |

(List continued on next page.)

FOREIGN PATENT DOCUMENTS

| | | |
|---|---|---|
| 0179582 | 4/1986 | European Pat. Off. |
| 476825 | 3/1992 | European Pat. Off. |
| 0504959 | 9/1992 | European Pat. Off. |
| 598762 | 6/1994 | European Pat. Off. |
| 4407274 | 3/1995 | Germany |
| 60234961 | 5/1984 | Japan |
| 60243273 | 5/1984 | Japan |
| 62058050 | 9/1985 | Japan |
| 96026349 | 7/1986 | Japan |

(List continued on next page.)

OTHER PUBLICATIONS

Jindal et al., "Adhesion Measurements of Chemically Vapor Deposited and Physically Vapor Deposited Hard Coatings on WC–Co Substrates," Thin Solid Films, 154 (1987) pp. 361–375.

Badzian, "Superhard Material Comparable in Hardness to Diamond," Appl. Physics Letter 53(25) 1988, pp. 2495–2498.

Holleck et al., "Multilayer PVD Coatings for Wear Protection," Surface and Coatings Technology, 76–77 (1995), pp. 328–336.

(List continued on next page.)

*Primary Examiner*—Archene Turner
*Attorney, Agent, or Firm*—John J. Prizzi

[57] ABSTRACT

A cutting tool includes a substrate and a coating on the substrate. The coating includes a base adhesion layer that is on at least a portion of the substrate. A first intermediate adhesion layer, which includes boron and a first element, that is on the base adhesion layer. A second intermediate adhesion layer, which includes boron, the first element, and nitrogen, that is on the first intermediate adhesion layer. An outer adhesion layer, which includes boron and nitrogen preferably in the form of cubic boron nitride, that is on the second intermediate adhesion layer. A wear coating scheme wherein the innermost layer of the wear coating scheme is on the outer adhesion layer.

75 Claims, 2 Drawing Sheets

U.S. PATENT DOCUMENTS

| | | |
|---|---|---|
| 4,807,402 | 2/1989 | Rai . |
| 4,892,791 | 1/1990 | Watanabe et al. . |
| 4,919,773 | 4/1990 | Naik ..................................... 404/38.4 |
| 4,965,140 | 10/1990 | Sarin . |
| 5,053,245 | 10/1991 | Kiyama et al. . |
| 5,096,740 | 3/1992 | Nakagama et al. . |
| 5,137,772 | 8/1992 | Watanabe et al. . |
| 5,208,079 | 5/1993 | Fukushima et al. . |
| 5,223,337 | 6/1993 | Van Den Berg et al. . |
| 5,249,554 | 10/1993 | Tamor et al. ........................... 428/408 |
| 5,266,388 | 11/1993 | Santhanam et al. .................... 428/212 |
| 5,310,603 | 5/1994 | Fukuda et al. . |
| 5,330,611 | 7/1994 | Doll ....................................... 117/105 |
| 5,356,727 | 10/1994 | Grenie et al. . |
| 5,372,873 | 12/1994 | Yoshimura et al. . |
| 5,374,471 | 12/1994 | Yoshimura et al. . |
| 5,389,445 | 2/1995 | Makowiecki et al. . |
| 5,389,587 | 2/1995 | Nakashima et al. . |
| 5,398,639 | 3/1995 | Doll et al. . |
| 5,433,988 | 7/1995 | Fukuda et al. . |
| 5,436,036 | 7/1995 | Shiomi et al. . |
| 5,441,817 | 8/1995 | Rai . |
| 5,483,920 | 1/1996 | Pryor . |
| 5,491,002 | 2/1996 | Slutz . |
| 5,503,913 | 4/1996 | Konig et al. . |
| 5,618,509 | 4/1997 | Shioi et al. ............................. 423/290 |
| 5,633,214 | 5/1997 | Nishio et al. ........................... 501/96.4 |
| 5,639,285 | 6/1997 | Yao et al. ................................ 51/307 |
| 5,639,551 | 6/1997 | Ong et al. ............................... 428/408 |
| 5,670,252 | 9/1997 | Makowiecki et al. .................. 428/336 |
| 5,691,260 | 11/1997 | Suzuki et al. ............................ 501/96 |

FOREIGN PATENT DOCUMENTS

| | | |
|---|---|---|
| 0205562 | 7/1988 | Japan . |
| 4124272 | 9/1990 | Japan . |
| 4168263 | 10/1990 | Japan . |
| 91013305 | 2/1991 | Japan . |
| 4337064 | 5/1991 | Japan . |
| 3260054 | 11/1991 | Japan . |
| 4216851 | 2/1993 | Japan . |
| 7018415 | 6/1993 | Japan . |
| 93054594 | 7/1993 | Japan . |
| 5286789 | 11/1993 | Japan . |
| 5-161280 | 3/1994 | Japan . |
| 9635820 | 11/1996 | WIPO . |

OTHER PUBLICATIONS

Chemical Abstracts, vol. 121, No. 2, p. 459, Jul. 4, 1994.

Kessler et al., "Laser Pulse Vapour Deposition of Polycrystalline Wurtzite–type BN," *Thin Solid Films*, 147 (1987) L45–L50.

DeVries, Cubic Boron Nitride: Handbook of Properties (Jun. 1972) pp. 1–17.

Peytany et al., "Chemical Vapor Deposition of Titanium Boronitride" *High Temperatures–High Pressures*, vol. 10 (1978) pp. 341–345.

Satou & Fujismoto "Formation of Cubic Boron Nitride Films by Boron Evaporation and Nitrogen Ion Beam Bombardment" *Japanese Journal of Applied Physics*, vol. 22, No. 3 (Mar. 1983), pp. L171–L172.

Goranchev et al., "Compresive Stress of Thin Cubic BN Films Prepared by R.F. Reactive Sputtering on R.F. Biased Substrates", *Thin Solid Films*, 149 (1987) pp. L77–L80.

Arya et al., "Preparation, Properties and Applications of Boron Nitride Thin Films", *Thin Solid Films*, 157 (1988) pp. 267–282.

Andoh et al., "On the Formation of BN Films By Ion Beam and Vapor Deposition", *Nuclear Instruments and Method in Physics Research*, B33 (1988) pp. 678–680.

Inagawa et al. "Structure and Properties of c–BN Film Deposited by Activated Reactive Evaporation with a Gas Activation Nozzle", *Surface and Coatings Technology*, 39/40 (1989) pp. 253–264.

Mitterer et al. "Sputter Deposition of Ultrahard Coatings Within the System Ti–B–C–N", *Surface and Coating Technology*, 41 (1990) pp. 351–363.

Mieno et al. "Preparation of Cubic Boron Nitride Films by RF Sputtering", *Japanese Journal of Applied Physics*, vol. 29, No. 7, (Jul. 1990)0 pp. L1175–1177.

Ikeda et al. "Formation of Cubic Boron Nitride Films by Arc–Like Plasma–Enhanced Ion Plating Method", *J. Vac. Sci. Technol.*, A8 (4), (Jul./Aug. 1990) pp. 3168–3174.

Montasser et al. "A Promising Boron–Carbon–Nitrogen Thin Film", *Materials Science Forum*, vols. 54 and 55 (1990), pp. 295–312.

Karnezos "Boron–Nitrogen–Hydrogen Thin films", *Materials Science Forum*, vols. 54 and 55 (1990), pp. 261–276.

Ikeda et al. "Formation and Characterization of Cubic Boron Nitride Films by an Arc–Like Plasma–Enhanced Ion Plating Method", *Surface and Coatings Technology*, 50 (1991) pp. 33–39.

Herr et al. "Fundamental Properties and Wear Resistance of R.F. –Sputtered $TiB_2$ and Ti(B,N) Coating", *Material Science and Engineering*, A140 (1991) pp. 616–624.

Aromaa et al. "A Comparative Study of the Corrosion Performance of TiN, Ti (B,N) and (Ti,Al) N Coatings Produced by Physical Vapour Deposition Methods", *Materials Science and Engineering*, A140 (1991) pp. 722–726.

Doll et al. "Growth and Characterization of Epitaxial Cubic Boron Nitride Films on Silicon", *Physical Review B*, (Mar. 15, 1991–I) pp. 6816–6819.

Edgar, "Prospects for Device Implementation of Wide Band Gap Semiconductors", *Journal of Materials Research*, vol. 7, No. 1 (Jan. 1992) pp. 235–252.

Ikeda, "Cubic Boron Nitride Flms Synthesized by Low–Energy Ion Beam–Enhanced Vapor Deposition", *American Institute of Physics–Appl. Phys. Lett*.61(7) (Aug. 17, 1992) pp. 786–788.

Kester et al., "Phase Control of Cubic Boron Nitride Thin Films", *American Institute of Physics—J. Appl. Phys.*72 (2), (Jul. 15, 1992) pp. 504–513.

Wada et al. "Formation of cBN Films by Ion Beam Assisted Deposition",*J. Vac. Sci. Technol. A*, vol. 10, No. 3 (May/Jun. 1992) pp. 515–520.

Stovicek, "Hard–Part Turning–Eliminates Grinding, Improves Quality", *Tooling & Production*, vol. 57, No. 11 (Feb. 1992), pp. 25–26.

Noaker, "Hard Facts on Hard Turning", *Manufacturing Engineering*, vol. 108, No. 2 (Feb. 1992) pp. 43–46.

Matthes et al. "Tribological Properties and Wear Behaviour of Sputtered Titanium–Based Hard Coatings Under Sheet–Metal–Forming Conditions", *Materials Science and Engineering*, A140 (1991) pp. 593–601.

Nishiyama et al., "The Synthesis and Properties of BN Films Prepared by Ion Irradiation and Vapor Deposition", *Nuclear Instruments & Methods in Physics Research*, vol. BBO/B1, Part III (Jun. (III) 1993) pp. 1484–1488, North–Holland.

Sueda "Fundamental Research on the Deposition of Cubic Boron Nitride Films on Curved Substrates by Ion–Beam–Assisted Vapor Deposition", *Thin Solid Films*, 228 (1993) pp. 97–99.

Stovicek "Turning to Hard–Part Turning" *Tooling & Production Magazine*, (Jan. 1993) pp. 31–33.

Kennametal Advertisement.

Brookes, "Tools on the Cutting Edge", *American Machinist*, (Dec. 1993), pp. 30–33.

Gissler, "Preparation and Characterization of Cubic Boron Nitride and Metal Boron Nitride Films", *Surface and Interface Analysis*, vol. 22 (1994), pp. 139–144.

Ong et al. "Deposition of Cubic BN on Diamond Interlayers", *NASA Tech Brief*, vol. 18, No. 8 (Aug. 1994) Item #74.

Riedel, "Novel Ultrahard Materials" *Advanced Materials*, 6 No. 7/8 (1994) pp. 549–560.

Zhang et al., "Deposition of High Quality Cubic Boron Nitride Films on Nickel Substrates", *American Institute of Physics–Appl. Phys. Lett.*65 (8) (Aug. 22, 1994) pp. 971–973.

Kroczynski et al., "Ion Beam–Assisted Deposition of Boron Nitride From a Condensed Layer of Diborane and Ammonia at 78K", *Materials Research Society, Symposium Proceedings*, vol. 316 (1994) pp. 869–873.

Ichiki, "Growth of Cubic Boron Nitride Films by Low–Pressure Inductively Coupled Plasma Enhanced Chemical Vapor Deposition", *Japanese Journal Appl. Phys.*, vol. 33, Part 1, No. 7B (Jul. 1994) pp. 4385–4388.

Yarbourgh, "Thermodynamics of c–BN?", *Materials Research Lab*, Penn State (Oct. 1994).

Inspektor et al., "Superhard Coating for Metal Cutting Application", *Surface and Coatings Technology*, 68/69 (1994) pp. 359–368.

Song et al., "Textured Growth of Cubic Boron Nitride Film on Nickel Substrates", *American Institute of Physics, Appl. Phys. Lett.*65 (Nov. 21, 1994) pp. 2669–2671.

Vasilash, "The Superhard Coatings: More Than Meets the Eye" *Production*, (Dec. 1995) pp. 52–54.

Kuhr et al., "Deposition of Cubic Boron Nitride with an Inductively Coupled Plasma", *Surface and Coating Technology*, 74–75 (1995) pp. 806–812.

Noaker, "Hard Turning Heats Up", *Manufacturng Eng.*, (Jun. 1995) pp. 47–50.

Sprow, "Diamond Coatings: Ready to Rip?", *Manufacturing Eng.*(Feb. 1995) pp. 41–46.

Cook, "PCBNs Cut into Marketplace", *Canadian Machining and Metalworking*, vol.. 88, No. 5 (Jun. 1993) pp. 13–14.

Murakawa et al., "The Synthesis of Cubic BN Films Using a Hot Cathode Plasma Discharge in a Parallel Magnetic Field", *Surface and Coatings Technology*, vol. 43–4, No. 1–3 (1990), pp. 128–136.

Murakawa et al., "Characteristics of c–BN Films Made by a Reactive Ion Plating Method", *New Diamond Science Technology Proceeding International Conference*, 2nd (1991) Edited by Russel Messier, Published by the Materials Research Society, pp. 1099–1104.

SUBSTRATE WITH SUPERHARD COATING CONTAINING BORON AND NITROGEN AND METHOD OF MAKING THE SAME

This is a divisional of application Ser. No. 08/627,464, filed on Apr. 4, 1996, now U.S. Pat. No. 5,976,716.

BACKGROUND

The invention pertains to a substrate that has an outer layer of a superhard material, as well as a method of making the same. More specifically, the invention pertains to a cutting tool, as well as a method of making the same, that has an adherent outer layer containing boron and nitrogen which applicant believes to be boron nitride wherein the predominant crystalline form is cubic boron nitride (cBN).

As materials technology advances many new materials, including new hard materials, become commercially useful. Such new hard materials include without limitation sintered ultra-fine powdered metals, metal-matrix composites, heat treated hardened steels (hardnesses of between 50 to 65 Rockwell C), and high temperature alloys. These new materials have extraordinary combinations of properties, such as, for example, hardness, toughness and wear resistance, that make them very suitable for uses in heavy industries, aerospace, transportation, and consumer products.

For these new hard materials to realize their optimum commercial potential, one must overcome the challenges these materials present to existing manufacturing and finishing processes. One of the reasons these challenges exist is that these materials are very difficult and expensive to drill, cut and form. One can best address these challenges by the use of strong cutting tools that use a superhard coating.

At the present time, the two primary superhard commercial cutting tools comprise a polycrystalline diamond (PCD) cutting tool and a polycrystalline cubic boron nitride (PCBN) cutting tool. Diamond has a Knoop 100 hardness of between about 75 GPa and about 100 GPa. Cubic boron nitride has a Knoop 100 hardness of about 45 GPa.

The PCBN cutting tools typically find application in the machining of hard ferrous materials. The PCD cutting tools have their typical application in the machining of hard non-ferrous alloys and difficult-to-cut composites. In the typical polycrystalline (PCD or PCBN) cutting tool, the cutting edge comprises a superhard tip brazed onto a carbide blank. The tip comprises micrometer sized diamond or cubic boron nitride (cBN) crystals intergrown with a suitable binder and bonded onto a cemented carbide support. The crystals and blanks are synthesized and sintered under high pressure-high temperature (HP-HT) conditions such as, for example, 50 kbar and about 1500° C.

The HP-HT manufacturing process, as well as the finishing process for these tips, each entails high costs. The result is that PCD cutting tools and PCBN cutting tools are very expensive. In addition to the expense, these cutting tools usually comprise a single tipped tool wherein the tip has relatively few styles with a planar geometry. Even though these cutting tools are expensive and come in relatively few styles, for the present time they are the best (and sometimes the only) cutting tool suitable to economically machine these new hard difficult-to-cut materials.

Through the development of techniques for the low pressure deposition of diamond one is able to deposit conforming layers (or films) of diamond on cutting tool substrates without any significant limitation to the geometry of the cutting tool. While the diamond-coated cutting tools have advantages over the PCD cutting tools, there remain some significant limitations to the use of diamond coated cutting tools.

One primary limitation with diamond cutting tools (i.e., PCD and diamond coated cutting tools) is that diamond oxidizes into carbon dioxide and carbon monoxide during high temperature uses. Another principal limitation with diamond cutting tools is the high chemical reactivity of diamond (i.e., carbon) with certain materials. More specifically, materials that contain any one or more of iron, cobalt, or nickel dissolve the carbon atoms in diamond. These limitations reveal that while diamond cutting tools provide certain advantages, there is a universe of materials that require a cutting tool with a superhard coating, but for which the use of a diamond cutting tool is inappropriate.

It is very apparent that there is a need to provide a cutting tool with an adherent superhard coating that overcomes the above problems extant with diamond-coated cutting tools. More specifically, there is a need to provide a cutting tool with an adherent superhard coating wherein the coating does not oxidize during high temperature use. There is also a need to provide a cutting tool with an adherent superhard coating wherein the coating does not chemically react with workpiece materials that contain any one or more of iron, cobalt, or nickel.

One superhard material that passivates by the formation of a protective oxide at high temperatures is boron nitride. In addition, boron nitride does not chemically react with any one or more of iron, nickel, or cobalt at typical metalworking temperatures. As a consequence, a workpiece which contains any one or more of iron, cobalt, or nickel does not dissolve the boron nitride. These advantageous properties of boron nitride exist with respect to all of the crystalline forms of boron nitride; however, those forms of boron nitride which exhibit a high hardness so as to provide for a superhard coating comprise the cubic boron nitride (cBN) and the wurtzitic boron nitride (wBN) crystalline forms of boron nitride wherein cBN has especially good properties and is the preferred crystalline form. It is to be expected, however, that a coating which is predominantly cBN will have some other crystalline forms of born nitride (e.g., amorphous boron nitride (aBN) and hexagonal boron nitride (hBN), as well as aBN contained therein and still exhibits excellent hardness, resistance to chemical reactivity, and passivation characteristics.

It thus becomes apparent that a boron nitride-coated cutting tool, especially a cBN-coated cutting tool, would possess highly desirable properties for the machining of new hard difficult-to-cut materials at high temperatures. It is also apparent that a boron nitride-coated cutting tool, especially a cBN-coated cutting tool, would possess highly desirable properties for the machining of new hard difficult-to-cut materials that contain one or more of iron, cobalt, or nickel.

The literature contains a number of articles that address the deposition of a thin film (or layer) of cBN onto a substrate in conjunction with the use of interlayers.

For example, the article by Murakawa et al. entitled "Characteristics of C-BN Film Made by a Reactive Ion Plating Method", pages 1009–1104 suggests two different basic approaches to the use of interlayers between the substrate and the cBN outer coating. One approach is to use a buffer interlayer alone that present a gradient of boron and nitrogen. The article suggests the post-treatment annealing of this coating scheme. The other approach is to use a titanium interlayer between the above buffer layer and the substrate.

The article by Gissler entitled "Preparation and Characterization of Cubic Boron Nitride and Metal Boron Nitride Films", *Surface and Interface Analysis*, Vol. 22, (1994), pp.

139–148 suggests the sequential deposition of multiple layers of Ti/BN with a subsequent annealing treatment. The Gissler article also suggests the addition of elements to the boron and nitrogen, such as, for example, titanium to form a Ti—B—N compound. However, the reference in Gissler to a coating within the system Ti—B—N—C having high hardness deals with a TiB$_2$ coating that does not use interlayers. Mitteier et al., "Sputter Deposition of Ultrahard Coatings Within the System Ti—B—C—N", *Surface and Coatings Technology*, 41 (1990), pp. 351–363.

The article by Ikeda et al. entitled "Formation and characterization of cubic boron nitride films by an arc-like plasma-enhanced ion plating method", *Surface and Coating Technology*, 50 (1991), pp. 33–39 suggests a coating scheme with a titanium base layer, a layer of boron and nitrogen with a concentration gradient that moves from a boron rich-BN (iBN) composition next to the titanium layer to a constituent BN next to the outer layer, and an outer layer of cBN. Ikeda et al. suggests the use of ion plating techniques to deposit the iBN layer.

The patent literature also presents a number of patents that discuss the deposition of a cBN layer onto a substrate in conjunction with the use of interlayers. In this regard, U.S. Pat. No. 4,731,303 for a CUBIC BORON NITRIDE COATED MATERIAL AND PRODUCING METHOD OF THE SAME to Hirano et al. suggests the use of an interlayer of the nitrides or nitroxides of any one or more of Al, Ga, In, and Tl. U.S. Pat. No. 4,892,791 and U.S. Pat. No. 5,137,772 for a BODY COATED WITH CUBIC BORON NITRIDE & METHOD FOR MANUFACTURING THE SAME to Watanabe et al. each show the use of interlayers that include nitrides or borides of the Group IVb, IIIb, Vb, IVa, Va, and VIa elements.

The above documents present various approaches to the deposition of a superhard coating containing boron and nitrogen. However, there remains a need to provide an approach that deposits such a coating that has a sufficient thickness so as to be useful as a cutting tool and as a wear product.

It thus becomes apparent that in addition to providing a cutting tool with an adherent superhard coating, it would be desirable to provide a cutting tool with an adherent superhard coating, which preferably contains boron and nitrogen and more preferably, contains cBN, wherein the coating has a sufficient thickness so as to provide an adequate useful life.

SUMMARY

It is a principal object of the invention to provide a substrate with an adherent coating of a superhard material which preferably contains boron and nitrogen, and more preferably cBN, wherein the coating has a sufficient thickness to provide an adequate useful life.

It is another object of the invention to provide a cutting tool with an adherent coating of a superhard material which preferably contains boron and nitrogen, and more preferably cBN, wherein the coating has a sufficient thickness to provide an adequate useful life.

In one form thereof, the invention is a cutting tool that comprises a substrate having a rake face and a flank face wherein the rake face and flank face intersect to form a cutting edge. There is a coating on the substrate. The coating comprises a base adhesion layer on at least a portion of the substrate; a first intermediate adhesion layer, which includes boron and a first element, on the base adhesion layer; a second intermediate adhesion layer, which includes boron, the first element, and nitrogen, on the first intermediate adhesion layer; an outer adhesion layer, which includes boron and nitrogen, on the second intermediate adhesion layer; and a wear coating scheme wherein the innermost layer of the wear coating scheme is on the outer adhesion layer.

In another form thereof, the invention is a process for the deposition of a coating scheme on a cutting tool that includes a substrate wherein the process comprises the steps of: depositing a base adhesion layer on the substrate; depositing a first intermediate adhesion layer including boron and a first element on the base adhesion layer; depositing a second intermediate adhesion layer including boron, the first element, and nitrogen on the first intermediate adhesion layer; depositing an outer adhesion layer including boron and nitrogen on the second intermediate adhesion layer; and depositing a wear coating scheme wherein the innermost layer of the wear coating scheme is on the outer adhesion layer.

In still another form thereof, the invention is a substrate with a coating on at least a part thereof. The coating comprises a base adhesion layer that is on at least a portion of the substrate; a first intermediate adhesion layer, which includes boron and a first element, that is on the base adhesion layer; a second intermediate adhesion layer, which includes boron, the first element, and nitrogen, that is on the first intermediate adhesion layer; an outer adhesion layer, which includes boron and nitrogen, that is on the second intermediate adhesion layer; and a wear coating scheme wherein the innermost layer of the wear coating scheme is on the outer adhesion layer.

BRIEF DESCRIPTION OF THE DRAWINGS

The following is a brief description of the drawings that form a part of the present patent application.

DETAILED DESCRIPTION

Figure 1:
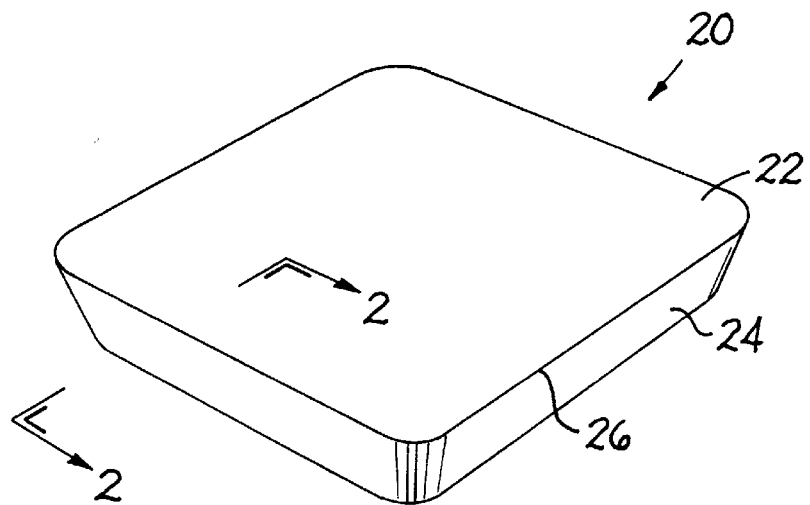
FIG. 1 is a isometric view of a specific embodiment of a cutting tool of the present invention.
Figure 2:
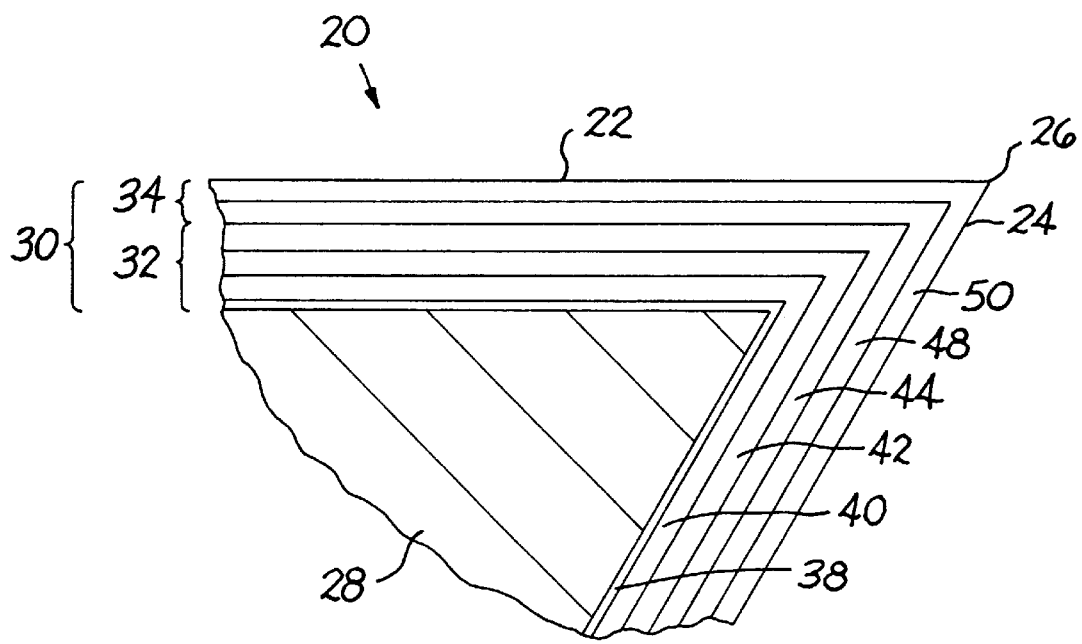
FIG. 2 is a cross-sectional view of the cutting tool of FIG. 1 taken along section line 2—2 so as to illustrate the coating scheme of this first specific embodiment.
Figure 3:
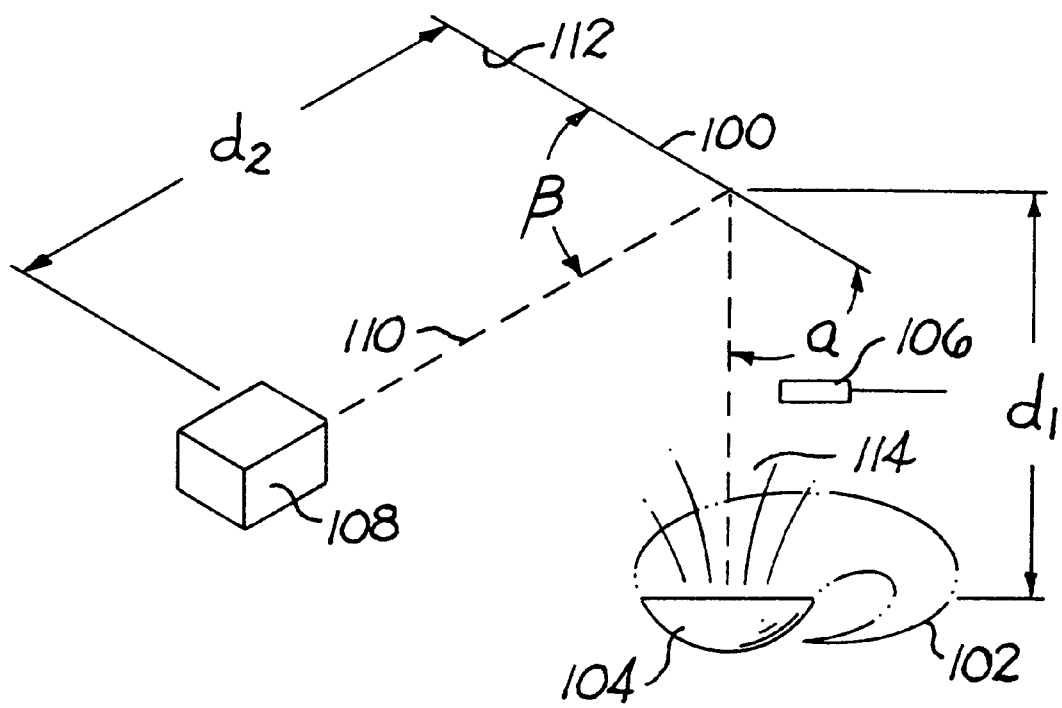
FIG. 3 is a mechanical schematic view of an apparatus for the practice of the method of the invention.

Referring to the drawings, FIGS. 1 and 2 illustrate a first specific embodiment of the invention, which is a cutting tool (generally designated as 20). Cutting tool 20 presents a rake face 22 and a flank face 24 which intersect to form a cutting edge 26. The coating scheme of the first specific embodiment (20) is generally representative of a sample that was a part of an actual run, i.e., Run No. 1, set forth hereinafter.

Cutting tool 20 further includes a substrate 28 on which there is a multi-layer coating scheme illustrated in brackets as 30. All of the samples used in Run No. 1 had cobalt cemented tungsten carbide substrates. However, as the samples used in Run No. 2 show, that ceramic substrates were also included in the actual runs.

In regard to the type of substrate material, the substrate may comprise, metals, ceramics, polymers, composites of combinations thereof, and combinations thereof. Metals may be elements, alloys, and/or intermetallics. Metals include elements of IUPAC Groups 2–14. Ceramics include boride(s), carbide(s) Nitride(s), oxide(s), their mixtures, their solid solutions, and combinations thereof. Polymers include organic and/or inorganic based polymers that retain desired mechanical and/or physical properties after the coating scheme has been applied to a portion thereof. Composites include metal matrix composite(s) (MMC), ceramic matrix composite(s) (CMC), polymer matrix composite(S) (PMC), and combinations thereof. Preferred composites include cermets, cemented carbide(s), and in particular cobalt cemented tungsten carbide, composites may include diamond tipped or diamond coated substrates, PCBN, or PCD.

Other typical materials include tungsten carbide-based material with other carbides (e.g. TaC, NbC, TiC, VC) present as simple carbides or in solid solution. In the case of cemented carbides, the amount of cobalt binder may range between about 0.2 weight percent and about 20 weight percent, although the more typical range is between about 5 weight percent and about 16 weight percent. It should be appreciated that other binder materials may be appropriate for use. In addition to cobalt and cobalt alloys, suitable metallic binders include nickel, nickel alloys, iron, iron alloys, and any combination of the above materials (i.e., cobalt, cobalt alloys, nickel, nickel alloys, iron, and/or iron alloys). Further, it should be appreciated that a substrate with binder (cobalt) enrichment near the surface of the substrate as disclosed in U.S. Reissue Pat. No. 34,180 to Nemeth et al. for PREFERENTIALLY BINDER ENRICHED CEMENTED CARBIDE BODIES AND METHOD OF MANUFACTURE (assigned to the assignee of the present patent application) may be appropriate for treatment with the coating scheme.

The multi-layer coating scheme 30 includes an adhesion coating scheme illustrated in brackets as 32, and a wear coating scheme illustrated in brackets as 34. The overall thickness of the multi-layer coating scheme should range between about 1 micrometer ($\mu$m) and 5 $\mu$m or more, and more preferably, the overall thickness should range between about 3 $\mu$m and about 5 $\mu$m.

Referring to the specific coating scheme of FIGS. 1 and 2, the adhesion coating scheme 32 comprises a base adhesion layer 38 that is next to the surface of the substrate 28. The base adhesion layer 38 comprises titanium metal. However, it should be appreciated that the base adhesion may comprise (or include) aluminum, magnesium, zirconium, or hafnium. The thickness of the base layer 38 ranges between about 10 Angstroms (Å) and about 10,000 Å wherein the typical thickness is about 1000 Å.

A first intermediate adhesion layer 40 is on the base layer 38. The first intermediate layer 40 contains boron and carbon. The atomic ratio of the boron to carbon atoms (B:C) is between about 2.7 to about 3.3. The thickness of the first intermediate layer 40 ranges between about 10 Angstroms (Å) and about 10,000 Å wherein the typical thickness is about 2000 Å.

A second intermediate adhesion layer 42 is on the first intermediate layer 40. The second intermediate layer 42 contains boron, carbon, and nitrogen. The boron-nitrogen atomic ratio (B:N) ranges between 29:71 and 54:46 (preferably 29:71 and 41:59) where the atomic percent for the carbon ranges between about 11 percent and about 26 percent. In other words, the atomic ratio of nitrogen to carbon (N:C) ranges between about 74:26 and about 89:11 where the atomic percent of boron is between about 29 percent and about 54 percent. The thickness of the second intermediate layer 42 ranges between about 10 Angstroms (Å) and about 10,000 Å wherein the typical thickness is about 2000 Å.

An outer adhesion layer 44 is on top of the second intermediate adhesion layer 42. The outer adhesion layer 44 comprises boron and nitrogen in an atomic ratio of between about 0.6 to about 5.7, i.e., the atomic percent for boron is between about 38 percent and about 85 percent. The thickness of the outer adhesion layer 44 ranges between about 1000 Angstroms (Å) and about 20,000 Å wherein the typical thickness is about 10,000 Å.

The multi-layer wear coating scheme 34 is on the adhesion coating scheme 32. In this specific embodiment there is one sequence of the basic wear coating scheme. However, applicant contemplates that multiple sequences of the basic wear coating scheme can be deposited to address certain applications. By the deposition of multiple sequences of the wear coating scheme, the overall thickness of the overall coating can be increased to a desired thickness.

Referring to the wear coating scheme 34, the base wear layer 48 is on the outer adhesion layer 44. The base wear layer 48 comprises boron, carbon, and nitrogen. The boron-nitrogen atomic ratio (B:N) ranges between 29:71 and 54:46 (preferably 29:71 and 41:59) where the atomic percent for the carbon ranges between about 11 percent and about 26 percent. In other words, the atomic ratio of nitrogen to carbon (N:C) ranges between about 74:26 and about 89:11 where the atomic percent of boron is between about 29 percent and about 54 percent. The thickness of the base wear layer 48 ranges between about 10 Angstroms (Å) and about 10,000 Å wherein the typical thickness is about 2000 Å.

The outer wear layer 50 comprises boron and nitrogen in an atomic ratio of between about 0.6 to about 5.7, i.e., the atomic percent for boron is between about 38 percent and about 85 percent. The thickness of the wear layer 50 ranges between about 1000 Angstroms (Å) and about 20,000 Å wherein the typical thickness is about 10,000 Å.

A cutting tool at least partially coated with the present coating scheme may be advantageously used in so-called "hard turning" or "hard machining" to displace grinding. Hard turning may include the process of cutting hardened alloys, including ferrous alloys such as steels, to final or finished form. The hardened alloy may be cut to accuracies of at least about ±0.0127 mm (0.0005 inch), preferably at least about ±0.0076 mm (0.0003 inch) and finishes better than about 20 micrometers rms on a lath or turning center. Cutting speeds, feeds, and depths of cut (DOC) may include any that are compatible with achieving the desired results. The cutting speed may range from about 50 to 300 meters/minute, preferably about 75 to 200 meters/minute, and more preferably about 80 to 150 meters/minute. Likewise, the feed may range from about 0.05 to 1 mm/revolution, preferably about 0.1 to 0.6 mm/revolution, and more preferably about 0.3 to 0.6 mm/revolution. Furthermore, the DOC may range from about 0.05 to 1 mm, preferably, about 0.1 to 0.25 mm, and more preferably about 0.1 to 0.3 mm. The above cutting parameters may be used either with or without a cutting or cooling fluid.

The total thickness of the overall multi-layer coating scheme 30 should range between about 1 micrometers (Å) and about 5 $\mu$m or more with the preferred range between about 3 $\mu$m and about 5 $\mu$m. As can be appreciated, the ability to deposit multiple sequences of the wear coating scheme provides the capability to deposit coatings with a selected overall thickness. By achieving the desired overall thickness of the coating on cutting tool 30, there is a great expectation for a satisfactory useful life of cutting tool 30.

In regard to the method of applying these coating layers, a number of deposition techniques would be expected to provide suitable results. Typical processes for the application of cBN coatings include ion beam assisted PVD techniques, nitrogen ion implantation, plasma chemical transport, radio frequency sputtering, ion plating, rf plasma CVD, and electron cyclotron resonance CVD. Applicant also considers that unbalanced magnetron (UBN) sputtering techniques would provide suitable results.

Techniques representative of CVD cBN synthesis include, for example, those described in "Deposition of Cubic BN on Diamond Interlayers" NASA Tech Briefs, Vol. 18, No. 8 p. 53; Z. Song, F. Zhang, Y. Guo, & G. Chin, "TEXTURED GROWTH OF CUBIC BORON NITRIDE FILM ON NICKEL SUBSTRATES" Applied Physics Letter", Vol. 65, No. 21, 1994, pp. 2669–2671; and M. Kuhr, S. Reinke, & W Kulisch, "DEPOSITION OF CUBIC BORON NITRIDE WITH AN INDUCTIVELY COUPLE PLASMA" Surface and Coating Technology, Vol. 74–75, 1995, pp. 806–812; and Murakawa & S. Watanabe, "THE SYNTHESIS OF CUBIC BN FILMS USING A HOT CATHODE PLASMA DISCHARGE IN A PARALLEL MAGNETIC FIELD," Coating Technology, Vol. 43, 1990, pp. 128–136.

Techniques representative of PVD cBN synthesis include, for example, those described in M. Mieno & T. Yosida, "PREPARATION OF CUBIC BORON NITRIDE FILMS BY SPUTTERING," Japanese Journal Of Applied Physics, Vol. 29, No. 7, July 1990, pp. L1175–L117; Kester et al., "PHASE CONTROL OF CUBIC BORON NITRIDE THIN FILMS", Journal of Applied Physics, Vol. 72, No. 2 (July 1990); Wada et al., "FORMATION OF CBN FILMS BY ION BEAM ASSISTED DEPOSITION", Journal of Vacuum Science Technology A., Vol. 10, No. 3 (May/June 1992); Ikeda et al., "FORMATION OF CUBIC BORON NITRIDE FILMS BY ARC-LIKE PLASMA-INDUCED ION PLATING METHOD", Journal of Vacuum Science Technology, Vol. 8, No. 4 (July/August 1990); and T. Ikeda, T. Satou, & H. Stoh, "FORMATION AND CHARACTERIZATION OF CUBIC BORON NITRIDE FILMS BY AN ARC-LIKE PLASMA-ENHANCED ION PLATING METHOD," Surface and Coating Technology, Vol. 50, 1991, pp. 33–39.

The specific process used for Runs Nos. 1 and 2 was an electron beam PVD process with ion beam assistance for forming the nitrogen-containing layers. A PVD technique is set forth in United States patent application entitled BORON AND NITROGEN CONTAINING COATING AND METHOD FOR MAKING by Aharon Inspektor (the applicant of the present patent application) which was filed on the same date as the present patent application and assigned to Kennametal Inc. (the same assignee as the assignee of the present patent application). The above patent application entitled BORON AND NITROGEN CONTAINING COATING AND METHOD FOR MAKING by Aharon Inspektor is hereby incorporated by reference herein.

The description of the specific equipment and procedure which was used to make the actual runs, i.e., Runs Nos. 1 and 2, is set forth hereinafter.

The appropriate equipment would be an AIRCO TEMESCAL FC 1800 fast cycle electron beam (e-beam) evaporator unit with a 20° C. water cooled high vacuum chamber equipped with a four-pocket e-beam gun and a radio frequency (RF) biased substrate holder was used. The unit would also include a residual gas analyzer (IQ 200 from Inficon), a quartz lamp for chamber heating, an ion source (Mark I gridless end-Hall type of ion gun from Commonwealth Scientific Corp. of Alexandria, Va.), a Faraday cup (interfaced to an IQ 6000 from Inficon), and filaments (or an additional quartz lamp) for supplemental substrate heating. While this specific arrangement used a single ion gun, the applicant contemplates that two ions guns may be suitable for the deposition of the coating scheme.

FIG. 4 depicts a substrate holder 100, an electron beam 102 for creating a vapor from a material source 104, the Faraday cup 106, and an ion source 108. Angle α was measured between the plane (112) of the substrate holder 100 and a line perpendicular to the surface of the vapor source and substantially parallel to the line of sight from the vapor source. Angle β was measured between the plane (112) of the substrate holder 106 and the line of sight (110) of the ion source 108. The distance between the surface of the material source 104 and the plane (112) of the substrate is identified as "$d_1$". The distance between the ion source 108 and the plane (112) of the substrate holder 100 is identified as "$d_2$".

Referring to the set up of the equipment as depicted in FIG. 4, the operating parameters comprised angle α being between about 45 degrees and about 75 degrees, angle β being between about 65 degrees and about 80 degrees, the distance $d_1$ being about 444 mm, the distance $d_2$ being between about 90 mm and about 165 mm.

The samples for Run No. 1 comprised a total of eight cutting tool samples wherein four of the cutting tools had a cobalt cemented tungsten carbide (WC—Co) substrate (i.e., Composition No. 1) with the following composition and basic properties: between about 5.4 and 5.9 weight percent cobalt, between about 1.4 to about 2.4 weight percent tantalum, no more than 0.2 weight percent titanium, no more than about 0.3 weight percent niobium, and the balance tungsten carbide. For Composition No. 1, the average grain size of the tungsten carbide is about 1–4 micrometers ($\mu$m), the specific gravity is between about 14.80 and about 15.10 grams per cubic centimeter (gm/cc), the Rockwell A hardness is between about 92.4 and about 93.0, the magnetic saturation is between about 85 and about 98 percent wherein 100 percent is equal to about 202 microtesla cubic meter per kilogram-cobalt ($\mu$Tm$^3$/kg) (about 160 gauss cubic centimeter per gram-cobalt (gauss-cm$^3$/gm)), and the coercive force is between about 230 and about 300 oersteds.

The other four cutting tools had a cobalt cemented tungsten carbide substrate (i.e., Composition No. 2) with the following composition and basic properties: between about 5.7 and 6.3 weight percent cobalt, no more than about 0.1 weight percent tantalum, no more than 0.1 weight percent titanium, no more than about 0.1 weight percent niobium, between about 0.3 and about 0.5 weight percent chromium, and the balance tungsten carbide. For Composition No. 1, the average grain size of the tungsten carbide is about 1–5 micrometers ($\mu$m), the specific gravity is between about 14.80 and about 15.00 grams per cubic centimeter (gm/cc), the Rockwell A hardness is between about 92.6 and about 93.4, the magnetic saturation is between about 83 and about 95 percent wherein 100 percent is equal to about 202 microtesla cubic meter per kilogram-cobalt ($\mu$Tm$^3$/kg) (about 160 gauss cubic centimeter per gram-cobalt (gauss-cm$^3$/gm)), and the coercive force is between about 250 and about 320 oersteds.

The samples for Run No. 2 comprised a total of ten cutting tools wherein two of the cutting tools had a cobalt cemented tungsten carbide (WC—Co) substrate of Composition No. 1. Six of the cutting tools had a cobalt cemented tungsten carbide substrate of Composition No. 2.

Two of the cutting tools had a SiAlON ceramic substrate. The SiAlON ceramic substrate comprised a dual silicon aluminum oxynitride phase α-SiAlON and β-SiAlON ceramic made substantially by the methods of U.S. Pat. No. 4,563,433 and having a density of about 3.26 g/cm$^3$, a Knoop hardness 200 g of about 18 GPa, a fracture toughness ($K_{IC}$) of about 6.5 MPa m$^{1/2}$, an elastic modulus of about 304 GPa, a shear modulus of about 119 GPa, a bulk modulus of about 227 GPa, a poission's ratio of about 0.27, a tensile strength of about 450 MPa, a transverse rupture strength of about 745 MPa, and an ultimate compressive strength of about 3.75 GPa.

The first step for Runs No. 1 and 2 was a substrate cleaning step. The purpose of this step was to clean the relevant environment (including the volume proximate to the surface of the substrate) and the surface of the substrate.

Referring to the units of measurement used in Table I through XIII, gas flow was measured in standard cubic centimeters per minute (sccm), the pressure was measured in Pascal (Pa), the temperature was measured in degrees Centigrade (° C.), the ion beam energy was measured in electron volts (eV), the electron beam setting was measured in a percentage (%) of the maximum power setting, and the evaporation rates were measured between the plane of the vaporizing source and the substrate holder (at a position about 254 mm from the surface of the vaporizing source and about 165 mm away from the center of the vaporizing source) in nanometers per second (nm/sec).

Table I below sets forth the parameters for the cleaning step for Runs Nos. 1 and 2.

TABLE I

Parameters for Cleaning the Substrate

| Parameter/ Run No. | Run No. 1 | Run No. 2 |
|---|---|---|
| Nitrogen Flow (sccm) | 10 | 10 |
| Chamber Pressure (Pa) | $6.7 \times 10^{-3}$ | $2 \times 10^{-2}$ |
| Temperature (° C.) | 338–471 | 419–597 |
| Ion Beam Energy (eV) | 140 | 170 |
| Time (minutes) | 15 | 30 |

For Runs Nos. 1 and 2, the next step comprised the deposition of a thin layer of titanium metal directly onto the surface of the substrate. The purpose of this step was to prepare (or condition) the surface of the substrate for the deposition of the subsequent layers. Titanium is a reactive metal that is a so-called "getter". In other words, the titanium reacts with oxygen and other contaminants in the chamber or on the substrate surface to form titanium compounds, and hence, remove the contaminants. Applicant contemplates other metals such as, for example, magnesium, aluminum, zirconium or hafnium, would also function to prepare the substrate for the deposition of the coating.

Table II below sets forth the parameters for the deposition of this base adhesion layer of titanium.

TABLE II

Parameters for Deposition of Titanium Base Adhesion Layer

| Parameter/ Run No. | Run No. 1 | Run No. 2 |
|---|---|---|
| Ti Evaporation Rate (nm/sec) | 0.4–0.5 | 0.46–0.48 |
| Chamber Pressure (Pa) | — | $9.3 \times 10^{-4}$ |
| Temperature (° C.) | 402–507 | 413–600 |

TABLE II-continued

Parameters for Deposition of Titanium Base Adhesion Layer

| Parameter/ Run No. | Run No. 1 | Run No. 2 |
|---|---|---|
| Electron Beam Energy Setting (% of Power) | 9 | 9 |
| Time (minutes) | 4 | 4 |

For Runs Nos. 1 and 2, after the deposition of the titanium base adhesion layer, the next step in the deposition of the adhesion coating scheme comprised the deposition on the titanium layer of the first intermediate adhesion layer which contained boron and carbon. In this regard, the parameters for the deposition of the first intermediate adhesion layer are set forth in Table III below.

TABLE III

Parameters for Deposition of the Boron-Carbon First Intermediate Adhesion Layer

| Parameter/ Run No. | Run No. 1 | Run No. 2 |
|---|---|---|
| B-C Evaporation Rate (nm/sec) | 0.15–0.7 | 0.15–0.28 |
| Chamber Pressure (Pa) | $2.7–4 \times 10^{-3}$ | $.2–2 \times 10^{-3}$ |
| Temperature (° C.) | 414–522 | 421–591 |
| Electron Beam Energy Setting (% of Power) | 8–9 | 8 |
| Time (minutes) | 12 | 17 |

For Runs Nos. 1 and 2, after the deposition of the first intermediate adhesion layer (containing boron and carbon), the next step in the deposition of the adhesion coating scheme comprised the deposition on the first intermediate adhesion layer of the second intermediate adhesion layer which contains boron, nitrogen, and carbon. In this regard, Table IV below sets forth the parameters for the deposition of the second intermediate adhesion layer via Runs Nos. 1 and 2.

TABLE IV

Parameters for Deposition of the Boron-Carbon-Nitrogen Second Intermediate Adhesion Layer

| Parameter/ Run No. | Run No. 1 | Run No. 2 |
|---|---|---|
| B-C Evaporation Rate (nm/sec) | 0.2–0.4 | 0.11–0.2 |
| Nitrogen Gas Flow Rate (sccm) | 10 | 10 |
| Chamber Pressure (Pa) | — | $1.6–1.7 \times 10^{-2}$ |
| Temperature (° C.) | 424–535 | 438–597 |

TABLE IV-continued

Parameters for Deposition
of the Boron-Carbon-Nitrogen
Second Intermediate Adhesion Layer

| Parameter/<br>Run No. | Run No.<br>1 | Run No.<br>2 |
|---|---|---|
| Electron Beam Energy Setting (% of Power) | 8–9 | 8–10 |
| Ion Beam Energy (eV) | 140 | 170 |
| Time (minutes) | 40 | 20 |

For Runs Nos. 1 and 2, after the deposition of the second intermediate adhesion layer, the next step in the deposition of the adhesion coating scheme comprised the deposition of the outer adhesion layer which contains boron and nitrogen (most preferably in the form of cBN). Table V set forth below sets forth the parameters for the deposition of this layer according to Runs Nos. 1 and 2.

TABLE V

Parameters for Deposition
of the Boron-Nitrogen Outer Adhesion Layer

| Parameter/Run No. | Run No. 1 | Run No. 2 |
|---|---|---|
| Boron Evaporation Rate (nm/sec) | — | 0.2–0.3 |
| Nitrogen Gas Flow Rate (sccm) | 10 | 10 |
| Chamber Pressure (Pa) | — | $1.7 \times 10^{-3}$ |
| Temperature (° C.) | 415–528 | 441–604 |
| Electron Beam Energy Setting (% of Power) | 7 | 8 |
| Ion Beam Energy (eV) | 140 | 170 |
| Time (minutes) | 30 | 57 |

For Runs Nos. 1 and 2, the deposition of the outer adhesion layer completed the deposition of the adhesion coating scheme.

Referring now to the adhesion coating scheme, the above runs show that the first intermediate adhesion layer and the second intermediate adhesion layer have two elements in common; namely, boron and carbon. However, applicant does not intend the scope of the invention to be limited to these common elements. Although the first intermediate adhesion layer and the second intermediate adhesion layer have two elements in common, applicant contemplates that only at least one element be in common between these layers. Applicant further contemplates that other elements, as well as a plurality of elements, may be common between the first and second intermediate adhesion layers. For example, the first intermediate adhesion layer may-contain three elements (other than boron and carbon) which are common to the constituents of the second intermediate adhesion layer.

The samples of the specific runs also show that the second intermediate adhesion layer and the outer adhesion layer have two elements in common; namely, boron and nitrogen. However, applicant does not intend the scope of the invention to be limited to these common elements. Although the second intermediate adhesion layer and the outer adhesion layer have two elements in common, applicant contemplates that only at least one element be in common between these layers. Applicant further contemplates that there may be other elements, as well as a plurality of elements, that are common between the second intermediate adhesion layer and the outer adhesion layer. For example, the second intermediate adhesion layer may contain three elements (other than boron and nitrogen) that are common to the constituents of the outer adhesion layer.

The specific embodiments of the first intermediate adhesion layer, the second intermediate adhesion layer, and the outer adhesion layer reveal that there is one element common between all three; namely, boron is the common element. Applicant does not intend to limit the scope of the invention to a coating scheme in which there is an element common to all of these layers (i.e., the first intermediate adhesion layer, the second intermediate adhesion layer, and the outer adhesion layer).

Furthermore, applicant does not intend to limit the scope of the invention to a coating scheme in which boron is the only common element. Applicant contemplates that there may be one or more elements (other than boron) that are common between the first intermediate adhesion layer, the second intermediate adhesion layer, and the outer adhesion layer.

Referring now to the deposition of the multi-layer wear coating scheme, this coating scheme was the next sequence of steps after the completion of the adhesion coating scheme. The multi-layer wear coating scheme was different for each one of the runs so that for ease of understanding, the multi-layer wear coating scheme for each run is set forth hereinafter.

Multi-Layer Wear Coating Scheme for Run No. 1

Referring to the multi-layer wear coating for Run No. 1, the base wear layer contained boron, carbon, and nitrogen. The parameters for the deposition of this layer are set forth in Table VI.

TABLE VI

Run No. 1 Parameters for the Deposition of
the Boron-Carbon-Nitrogen Base Wear Layer

| Time (minutes) | B-C Deposition Rate (nm/sec) | Nitrogen Flow (sccm) | Pressure (Pa) | Temperature (° C.) | Electron Beam Setting (%) | Ion Beam Energy (eV) |
|---|---|---|---|---|---|---|
| 25 | — | 10 | — | 410–526 | 5–6 | 140–170 |

After the deposition of the base wear layer, the next step was the deposition of the outer wear layer. The outer wear layer contained boron and nitrogen. The parameters for the deposition of this layer are set forth in Table VII below.

TABLE VII

Run No. 1 Parameters for the Deposition of
the Boron-Nitrogen Outer Wear Layer

| Time (minutes) | Boron Deposition Rate (nm/sec) | Nitrogen Flow (sccm) | Pressure (Pa) | Temperature (° C.) | Electron Beam Setting (%) | Ion Beam Energy (cV) |
|---|---|---|---|---|---|---|
| 56 | .1–.12 | 10 | — | 410–529 | 6–7 | 140–170 |

This completed the deposition of the overall coating scheme for Run No. 1.

The overall coating scheme for the samples of Run No. 1 thus comprised an adhesion coating scheme and a wear coating scheme. The adhesion coating scheme comprised the following layers: Ti/B—C/B—C—N/B—N. The wear coating scheme comprised the following layers: B—C—N and B—N.

Multi-Layer Wear Coating for Run No. 2

For the samples made according to Run No. 2, the base wear layer comprised titanium, boron and, nitrogen. The parameters for the deposition of this layer are set forth in Table VIII below.

TABLE VIII

Run No. 2 Parameters for the Deposition of
the Titanium-Boron-Nitrogen Base Wear Layer

| Time (minutes) | Titanium Boride (TiB$_2$) Deposition Rate (nm/sec) | Nitrogen Flow Rate (sccm) | Pressure (Pa) | Temperature (° C.) | Electron Beam Setting (%) | Ion Beam Energy (cV) |
|---|---|---|---|---|---|---|
| 5 | .019–.021 | 10 | $1.2 \times 10^{-2}$ | 437–594 | 9 | 170 |

The next step comprised the deposition of the outer wear layer which contained boron and nitrogen. The parameters for the deposition of this layer are set forth in Table IX.

TABLE IX

Run No. 2 Parameters for the Deposition of
the Boron-Nitrogen Outer Wear Layer

| Time (minutes) | Boron Deposition Rate (nm/sec) | Nitrogen Flow Rate (sccm) | Pressure (Pa) | Temperature (° C.) | Electron Beam Setting (%) | Ion Beam Energy (cV) |
|---|---|---|---|---|---|---|
| 57 | .20–.30 | 10 | $1-1.2 \times 10^{-2}$ | 433–604 | 8 | 170 |

The deposition of the outer wear layer completed the overall coating scheme for Run No. 2. The overall coating scheme comprised an adhesion coating which comprised four layers (Ti/B—C/B—C—N/B—N) and a wear coating scheme which comprises a base layer containing titanium, boron, and nitrogen, and an outer layer containing boron and nitrogen.

The vapor source materials that would be used during the various steps of the deposition would include titanium, boron carbide, titanium boride (TiB$_2$), and boron. The titanium and boron carbide would each comprise 99.9 weight percent (wt %) commercially available materials, while the boron and titanium boride would comprise 99.5 wt % commercially available material.

The samples of Runs Nos. 1 and 2 reveal that there are two elements in common between the outer adhesion layer and the base wear layer. For the samples of Run No. 1, the common elements are boron and nitrogen. For the samples of Run No 2., the common elements are also boron and nitrogen. While it is not a requirement of the coating scheme, applicant contemplates that for the preferred coating scheme there is at least one element in common between the outer adhesion layer and the base wear layer.

The samples of Runs Nos. 1 and 2 also reveal that there are two elements in common between the outer wear layer and the base wear layer. For the samples of both Runs Nos. 1 and 2 the common elements between these layers are boron and nitrogen. While it is not a requirement of the coating scheme, applicant contemplates that for the preferred coating scheme there is at least one element in common between the outer wear layer and the base wear layer.

Although the samples of Runs Nos. 1 and 2 do not show the presence of intermediate layers between the base wear layer and the outer layer, applicant contemplates that one or more intermediate layers may be useful. In addition, although the samples of Runs Nos. 1 and 2 do not show a repeatable wear coating scheme, applicant contemplates that the wear coating scheme may be repeated one or more times so as to achieve an overall coating of a sufficient thickness. In this regard, the overall thickness of the coating (i.e., the combined thickness of the adhesion coating scheme and the wear coating scheme) should range between about 1 μm and about 5 μm or more with the preferred range for the overall thickness of the coating being between about 3 μm and about 5 μm.

The previously described versions of the present invention have many advantages, including allowing the use of a boron and nitrogen, preferably cBN, containing coatings with tooling such as, for example, chip forming cutting inserts, for drilling, turning, milling, and/or forming the hard, difficult-to-cut materials, and other indexable as well as nonindexable tooling. Furthermore, this tooling may be used to machine metals, ceramics, polymers, composites of combinations thereof, and combinations thereof. In particular this tooling may be used to cut, drill, and form materials that are incompatible with diamond such as, for example, iron base alloys, nickel base alloys, cobalt case alloys, titanium base alloys, hardened steels, hard cast iron, soft cast iron, and sintered irons.

Although the present invention has been described in considerable detail with reference to certain preferred versions thereof, other versions are possible. Examples include: coatings in wear parts for such applications as TAB bonders for electronic applications, dies, and punches; coatings on carbide tips in mining tools, construction tools, earth drilling tools, and rock drilling tools; thin coatings on sliders used in magneto-resistive (YiR) computer disk drives; and transparent coatings on bar scanner code scanner windows.

All patents and other documents identified in this application are hereby incorporated by reference herein.

Other embodiments of the invention will be apparent to those skilled in the art from a consideration of the specification or practice of the invention disclosed herein. It is intended that the specification and the actual runs described therein be considered as illustrative only, with the true scope and spirit of the invention being indicated by the following claims.

What is claimed is:

1. A process for the deposition of a coating scheme on a cutting tool that includes a substrate, the process comprising the steps of:

depositing a base adhesion layer on the substrate;

depositing a first intermediate adhesion layer not containing nitrogen and including boron and a first element on the base adhesion layer;

depositing a second intermediate adhesion layer including boron, the first element, and nitrogen on the first intermediate adhesion layer;

depositing an outer adhesion layer including boron and nitrogen on the second intermediate adhesion layer; and depositing a wear coating scheme wherein an innermost layer of the wear coating scheme is on the outer adhesion layer.

2. A process according to claim 1 wherein the base adhesion layer includes a reactive metal, the reactive metal is selected from the group consisting of titanium, zirconium, hafnium, magnesium and aluminum.

3. A process according to claim 1 wherein the first element comprises carbon.

4. A process according to claim 1 wherein the first intermediate adhesion layer and the second intermediate layer have at least one element in common.

5. A process according to claim 1 wherein the second intermediate adhesion layer and the outer adhesion layer have at least one element in common.

6. A process according to claim 1 wherein the first intermediate adhesion layer, the second intermediate layer and the outer adhesion layer have at least element in common.

7. A process according to claim 1 wherein the substrate comprise a substrate for use in one of drilling, turning, and milling.

8. A process according to claim 1 wherein the substrate comprises an insert for use in one of drilling, turning, and milling.

9. A process according to claim 8 wherein the insert comprises an indexable insert.

10. A process according to claim 1 wherein the substrate comprises a metal.

11. A process according to claim 1 wherein the substrate comprises a ceramic.

12. A process according to claim 1 wherein the wear coating scheme has a thickness sufficient to withstand turning of a hardened alloy.

13. A process according to claim 1 wherein the wear coating scheme has a thickness sufficient to withstand turning of a ferrous alloy.

14. A process according to claim 1 wherein the wear coating scheme has a thickness sufficient to withstand turning of a hardened steel.

15. A process according to claim 1 wherein the coating scheme has thickness comprising at least about 1 micrometer.

16. A process according to claim 1 wherein the coating scheme has thickness comprising at least about 3 micrometers.

17. A process according to claim 1 wherein the coating scheme has thickness comprising up to about 5 micrometers.

18. A process according to claim 1 wherein the step of depositing the wear coating scheme includes depositing a base wear layer on the outer adhesion layer.

19. A process according to claim 18 wherein the depositing the wear coating scheme further includes depositing an outer wear layer on the base wear layer.

20. A process according to claim 19 wherein the base wear layer comprises boron, nitrogen, and carbon; and the outer wear layer comprises boron and nitrogen.

21. A process according to claim 19 wherein the first element comprises carbon; the base wear layer comprises boron, nitrogen, and carbon; and the outer wear layer comprises boron and nitrogen.

22. A process according to claim 19 wherein the outer layer of the wear coating scheme comprising boron and nitrogen.

23. A process according to claim 19 wherein the outer layer of the wear coating scheme comprising boron nitride.

24. A process according to claim 19 wherein the outer wear layer of the wear coating scheme comprising cubic boron nitride.

25. A process according to claim 24 wherein the cubic boron nitride outer wear layer is deposited using one of a chemical vapor deposition and a physical vapor deposition technique.

26. A process according to claim 24 wherein the cubic boron nitride outer wear layer is deposited using one of an ion beam assisted PVD technique, a nitrogen ion implantation technique, a plasma chemical transport technique, a radio frequency sputter technique, an ion plating technique, an rf plasma CVD technique, an electron cyclotron resonance CVD technique, and an unbalanced megatron sputtering technique.

27. A process according to claim 24 wherein the outer layer is deposited using an ion beam assisted PVD technique.

28. A process according to claim 27 wherein the ion beam comprises one of a nitrogen ion beam and an argon ion beam.

29. A process according to claim 1 wherein the substrate comprises a composite.

30. A process according to claim 29 wherein the composite comprises a cemented carbide.

31. A process according to claim 30 wherein the cemented carbide comprises a cemented carbide having an enrichment of binder near a surface of the substrate.

32. A process according to claim 30 wherein the cemented carbide comprises a cobalt cemented tungsten carbide.

33. A process according to claim 29 wherein the composite comprises a cermet.

34. A process for the deposition of a coating scheme on a cutting tool that includes a substrate, the process comprising the steps of:

depositing by a PVD technique a base adhesion layer, the base adhesion layer being on at least a portion of the substrate:

depositing by a PVD technique a first intermediate adhesion layer not containing nitrogen and including boron and a first element, the first intermediate adhesion layer being on the base adhesion layer;

depositing by a PVD technique a second intermediate adhesion layer including boron, the first element, and nitrogen, the second intermediate adhesion layer being on the first intermediate adhesion layer;

depositing by a PVD technique an outer adhesion layer including boron and nitrogen, the outer adhesion layer being on the second intermediate adhesion layer; and depositing by a PVD technique a wear coating scheme, an innermost layer of the wear coating scheme being on the outer adhesion layer.

35. A process according to claim 34 wherein the base adhesion layer includes a reactive metal, the reactive metal selected from the group consisting of titanium, zirconium, hafnium, magnesium, and aluminum, and the first element is carbon.

36. A process according to claim 34 wherein the first element comprises carbon.

37. A process according to claim 34 wherein the first intermediate adhesion layer and the second intermediate layer have at least one element in common.

38. A process according to claim 34 wherein the second intermediate adhesion layer and the outer adhesion layer have at least one element in common.

39. A process according to claim 34 wherein the first intermediate adhesion layer, the second intermediate layer and the outer adhesion layer have at least element in common.

40. A process according to claim 34 wherein the wear coating scheme comprises a base wear layer on the outer adhesion layer.

41. A process according to claim 40 wherein the depositing of the wear coating scheme further includes depositing by a PVD technique an outer wear layer on the base wear layer.

42. A process according to claim 41 wherein the first element comprises carbon: the base wear layer comprises boron, nitrogen, and carbon: and the outer wear layer comprises boron and nitrogen.

43. A process according to claim 41 wherein the outer wear layer comprises boron nitride.

44. A process according to claim 41 wherein the outer wear layer comprises boron and nitrogen.

45. A process according to claim 41 wherein the outer wear layer comprises cubic boron nitride.

46. A process according to claim 45 wherein the depositing by a PVD technique comprises one of an ion beam assisted PVD technique, a nitrogen ion implantation technique, a radio frequency sputter technique, an ion plating technique, and an unbalanced megatron sputtering technique.

47. A process according to claim 45 wherein the depositing by a PVD technique of an outer layer comprises using an ion beam assisted PVD technique.

48. A process according to claim 45 wherein the ion beam comprises one of a nitrogen ion beam and an argon ion beam.

49. A process for the deposition of a coating scheme on a cutting tool that includes a substrate, the process comprising the steps of:

depositing a base adhesion layer, the base adhesion layer being on at least a portion of the tooling substrate, depositing a first intermediate adhesion layer not containing nitrogen and including boron and a first element, the first intermediate adhesion layer being on the base adhesion layer;

depositing a second intermediate adhesion layer including boron, the first elements and nitrogen the second intermediate adhesion layer being on the first intermediate adhesion layer;

depositing an outer adhesion layer including boron and nitrogen, the outer adhesion layer being on the second intermediate adhesion layer; and depositing a sequence of a basic wear coating scheme, an innermost layer of the sequence being on the outer adhesion layer.

50. A process according to claim 49 wherein the base adhesion layer includes a reactive metal, the reactive metal selected from the group consisting of titanium, zirconium, hafnium, magnesium, and aluminum, and the first element is carbon.

51. A process according to claim 49 wherein the base adhesion layer includes titanium.

52. A process according to claim 49 wherein the base coating scheme comprises a base wear layer and the base wear layer of a first sequence is deposited on the outer adhesion layer.

53. A process according to claim 49 wherein the depositing of the base wear coating scheme further includes depositing an outer wear layer on the base wear layer.

54. A process according to claim 53 wherein the base wear layer of a second sequence is deposited on the outer wear layer of the first sequence.

55. A process according to claim 54 wherein the base wear layer of the first sequence and the wear layer of the second sequence are substantially the same and the first element comprises carbon.

56. A process according to claim 55 wherein the outer wear layer of the first sequence and the outer wear layer second sequence are substantially the same and the first element comprises carbon; the base wear layer comprises boron, nitrogen, and carbon; and the outer wear layers comprises boron and nitrogen.

57. A process according to claim 56 wherein the outer wear layer comprises boron nitride.

58. A process according to claim 56 wherein the outer wear layer comprises cubic boron nitride.

59. A process according to claim 49 wherein the first intermediate adhesion layer and the second intermediate layer have at least one element in common.

60. A process according to claim 49 wherein the second intermediate adhesion layer and the outer adhesion layer have at least one element in common.

61. A process according to claim 49 wherein the first intermediate adhesion layer, the second intermediate layer and the outer adhesion layer have at least element in common.

62. A process according to claim 49 wherein the substrate comprises a substrate for use in one of drilling, turning, and milling.

63. A process according to claim 49 wherein the substrate comprises an insert for use in one of drilling, turning, and milling.

64. A process according to claim 62 wherein the insert comprises an indexable insert.

65. A process according to claim 49 wherein the substrate comprises a metal.

66. A process according to claim 49 wherein the substrate comprises a composite.

67. A process according to claim 66 wherein the composite comprises a cemented carbide.

68. A process according to claim 67 wherein the cemented carbide comprises a cemented carbide having an enrichment of binder near a surface of the tooling substrate.

69. A process according to claim 67 wherein the cemented carbide comprises a cobalt cemented tungsten carbide.

70. A process according to claim 66 wherein the composite comprises a cermet.

71. A tool substrate according to claim 49 wherein the substrate comprises a ceramic.

72. A process according to claim 49 wherein the coating has thickness comprising at least about 1 micrometer.

73. A process according to claim 49 wherein the coating has thickness comprising at least about 3 micrometers.

74. A process according to claim 49 wherein the coating has thickness comprising up to about 5 micrometers.

75. A process according to claim 49 wherein a first intermediate adhesion layer has a thickness of about 10 Å to about 10,000 Å, the second intermediate adhesion layer having a thickness of about 10 Å to about 10,000 Å and the outer adhesion layer has a thickness of about 10 Å to about 20,000 Å.

* * * * *